United States Patent
Toh et al.

(10) Patent No.: US 9,184,165 B2
(45) Date of Patent: Nov. 10, 2015

(54) 1T SRAM/DRAM

(71) Applicant: GLOBALFOUNDRIES Singapore Pte. Ltd., Singapore (SG)

(72) Inventors: Eng Huat Toh, Singapore (SG); Danny Pak-Chum Shum, Singapore (SG); Shyue Seng Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/173,825

(22) Filed: Feb. 6, 2014

(65) Prior Publication Data

US 2015/0221651 A1 Aug. 6, 2015

(51) Int. Cl.
| | | |
|---|---|---|
| H01L 29/76 | (2006.01) | |
| H01L 27/108 | (2006.01) | |
| H01L 29/78 | (2006.01) | |
| H01L 29/66 | (2006.01) | |
| H01L 29/06 | (2006.01) | |
| H01L 29/165 | (2006.01) | |
| H01L 29/161 | (2006.01) | |
| H01L 21/762 | (2006.01) | |
| H01L 21/265 | (2006.01) | |
| H01L 21/02 | (2006.01) | |
| H01L 21/3065 | (2006.01) | |

(52) U.S. Cl.
CPC .... *H01L 27/10802* (2013.01); *H01L 21/02532* (2013.01); *H01L 21/02636* (2013.01); *H01L 21/26533* (2013.01); *H01L 21/3065* (2013.01); *H01L 21/76243* (2013.01); *H01L 29/0649* (2013.01); *H01L 29/161* (2013.01); *H01L 29/165* (2013.01); *H01L 29/6659* (2013.01); *H01L 29/66545* (2013.01); *H01L 29/7833* (2013.01); *H01L 29/7841* (2013.01)

(58) Field of Classification Search
CPC ..................... H01L 29/7841; H01L 27/10802
USPC ................................... 257/E21.661, E27.098
See application file for complete search history.

(56) References Cited

U.S. PATENT DOCUMENTS

| | | | |
|---|---|---|---|
| 6,245,618 B1* | 6/2001 | An et al. ........................ 438/289 |
| 2005/0191812 A1* | 9/2005 | Pritchard et al. .............. 438/299 |
| 2009/0108292 A1* | 4/2009 | Liu et al. ........................ 257/190 |
| 2013/0264656 A1* | 10/2013 | Widjaja et al. ................ 257/402 |

* cited by examiner

*Primary Examiner* — Ha Tran T Nguyen
*Assistant Examiner* — Aaron Dehne
(74) *Attorney, Agent, or Firm* — Horizon IP Pte. Ltd.

(57) ABSTRACT

One-transistor (1T) volatile memory devices and manufacturing methods thereof are provided. The device includes a substrate having top and bottom surfaces and an isolation buffer layer disposed below the top substrate surface. The isolation buffer layer is an amorphized portion of the substrate. An area of the substrate between the isolation buffer layer and the top substrate surface serves as a body region of a transistor. The device also includes a transistor disposed over the substrate. The transistor includes a gate disposed on the top substrate surface, and first and second diffusion regions disposed in the body region adjacent to first and second sides of the gate.

20 Claims, 17 Drawing Sheets

1T SRAM/DRAM

BACKGROUND

Volatile memory systems, such as random-access memory (RAM), are widely used as a form of primary data storage in computer memories. Volatile memory devices perform read and write operations quickly, allowing fast access to transiently stored data when the memory devices are powered. The stored data is lost when the devices are not powered. Presently, volatile memory devices are utilized in a wide range of applications including, for example, mobile phones, digital cameras, personal computers, and other applications where permanent data storage is not required or when fast data manipulation is desired. Typical volatile memory devices include, for example, Static RAM (SRAM) and Dynamic RAM (DRAM). Volatile memory devices are widely implemented in the form of embedded memory.

In recent years, development in RAM technology has presented floating body cells (FBCs) as an alternative data storage solution to conventional DRAM and SRAM, combining fast operation with high packing density. Volatile memory cells that rely on a floating body for data storage are thus known as floating body RAM (FBRAM). However, current process methods to manufacture FBRAMs face limitations with regard to manufacturing costs, operation voltage, and data retention period.

From the foregoing discussion, there is a need to provide improved RAM devices as well as simplified and cost effective methods to form such devices.

SUMMARY

Embodiments generally relate to memory devices. In one embodiment, a device is disclosed. The device includes a substrate having top and bottom surfaces and an isolation buffer layer disposed below the top substrate surface. The isolation buffer layer is an amorphized portion of the substrate. An area of the substrate between the isolation buffer layer and the top substrate surface serves as a body region of a transistor. The device also includes a transistor disposed over the substrate. The transistor includes a gate disposed on the top substrate surface, and first and second diffusion regions disposed in the body region adjacent to first and second sides of the gate.

In another embodiment, a method of forming a device is disclosed. The method includes providing a substrate having top and bottom surfaces and forming an isolation buffer layer. The isolation buffer layer is formed by amorphizing a portion of the substrate below the top substrate surface. An area of the substrate between the isolation buffer layer and the top substrate surface which is not amorphized serves as a body region of a transistor. A transistor is formed over the substrate. The formation of the transistor includes forming a gate on the top substrate surface, and forming first and second diffusion regions in the body region adjacent to first and second sides of the gate.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to devices, such as semiconductor devices or ICs. Particularly, some embodiments relate to memory devices, such as volatile memory devices. More particularly, some embodiments relate to FBRAM devices. Such memory devices, for example, can be incorporated into standalone memory devices, such as signal processors, or ICs, such as microcontrollers or system on chips (SoC). The devices or ICs can be incorporated into or used with, for example, consumer electronic products, such as computers, cell phones, or relate to other types of devices.

A volatile memory device according to the present disclosure offers a number of advantages compared to existing volatile devices. For instance, the substrate manufacturing cost is reduced, while data retention period and overall memory cell performance are improved.

Figure 1:
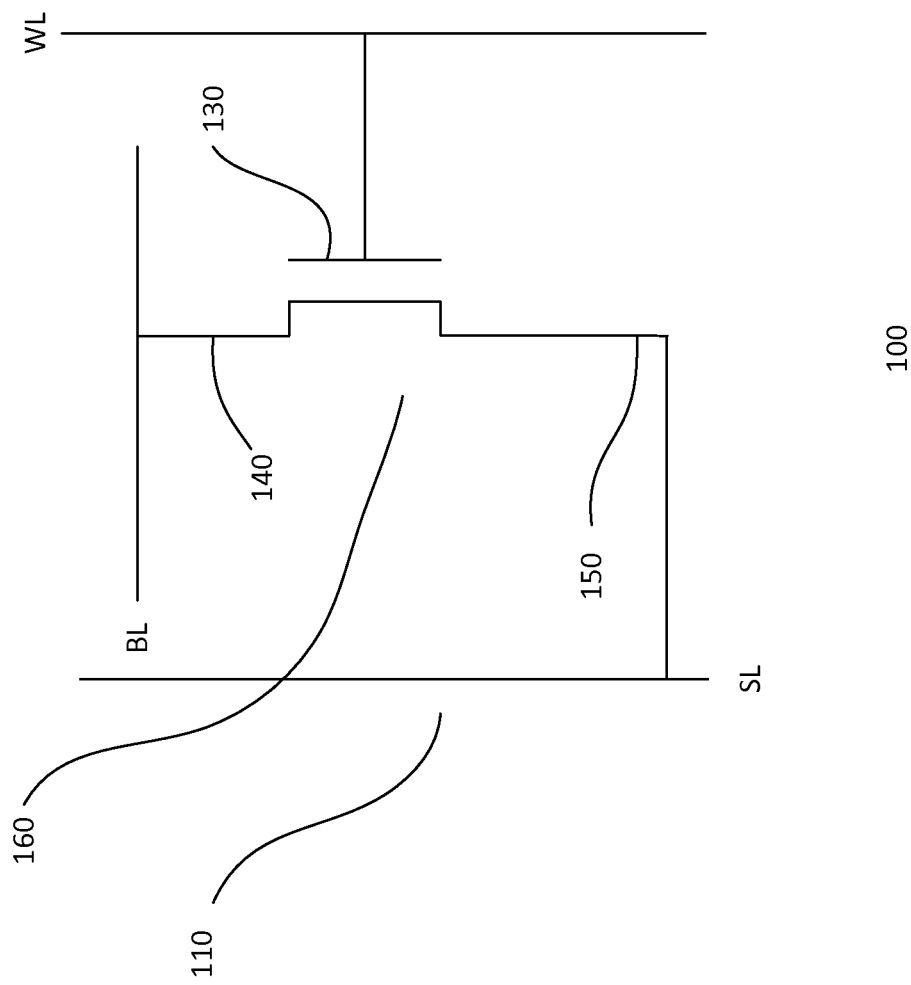
FIG. 1 shows a circuit diagram in accordance with an embodiment of a device.

FIG. 1 shows a schematic diagram of an embodiment of a device. In one embodiment, the device includes a memory cell 100. The memory cell, in one embodiment, is a volatile memory cell. In one embodiment, the volatile memory cell is a one transistor DRAM (1T-DRAM) cell. In another embodiment, the volatile memory cell is a one transistor SRAM (1T-SRAM) cell. Other types of devices or memory cells may also be useful.

As shown, the memory cell includes a transistor 110. The transistor includes first and second source/drain (S/D) terminals 140 and 150. The transistor further includes a gate terminal 130 disposed between the first and second S/D terminals. The first S/D terminal is coupled to a bitline (BL) and the second S/D terminal is coupled to a source line (SL). As for the gate terminal, it is coupled to a word line (WL). The WL is along a first direction and the BL is along a second direction. As for the SL, it may be disposed in the first direction. The first and second directions, for example, are orthogonal to each other. The SL, for example, is coupled to ground. Alternatively, the SL could be coupled to a bias voltage.

The transistor includes a body 160. In one embodiment, the transistor body is a floating transistor body. For example, the transistor body is isolated from a substrate on which the transistor is formed. The transistor is isolated from the semiconductor substrate by a buried isolation buffer layer. The semiconductor substrate, for example, is a single crystalline substrate, such as silicon. In one embodiment, the buried isolation buffer layer is an amorphous substrate layer. For example, the buried isolation buffer layer is an amorphous silicon layer. Other types of amorphous substrate layers may also be useful. The amorphous layer depends on the type of substrate.

The floating body serves as a storage element employed for storing information. By providing the appropriate bias at the BL and WL, charge carriers may accumulate at or dissipate from a storage region of the body. In the case of a nMOS cell, the charge carriers are holes while in the case of a pMOS cell, the charge carriers are electrons. In one embodiment, the storage region is located near the buried isolation buffer layer/ floating body interface. In another embodiment, the storage region is within the floating body, such as within a band engineered floating body as will be described later. Providing a storage region at the buried isolation buffer layer/floating body interface or other suitable locations may also be useful. The presence or absence of the accumulation layer corresponds to first and second states of the memory cell, such as a logic "1" or logic "0". For example, writing a logic "1" to the memory cell may include forming the accumulation layer by impact ionization. Alternatively, writing a logic "0" to the memory cell may include removing the accumulation layer.

A plurality of memory cells may be interconnected by BLs and WLs to form an array. The SL may be a common SL for cells of the array. Each memory cell is capable of different operations including read, program (PGM) and erase (ERS). The operating voltages for different terminals of selected and unselected cells are shown in Table 1 below.

TABLE 1

| Operation | SL_Sel | SL_UnSel | BL_Sel | BL_UnSel | WL_Sel | WL_UnSel |
|---|---|---|---|---|---|---|
| Read | GND | GND or Vinhibit | VBL_RD (+) | GND or Vinhibit | VWL_RD (+) | GND or Vinhibit |
| PGM | GND | GND or Vinhibit | VBL_PGM (+) | GND or Vinhibit | VWL_PGM (+) | GND or Vinhibit |
| ERS | GND | GND or Vinhibit | VBL_ERS (−) | GND or Vinhibit or VBL_ERS (−) If page ERS | VWL_ERS (+) | GND or Vinhibit or VWL_ERS (+) If page ERS |

Figure 2A:
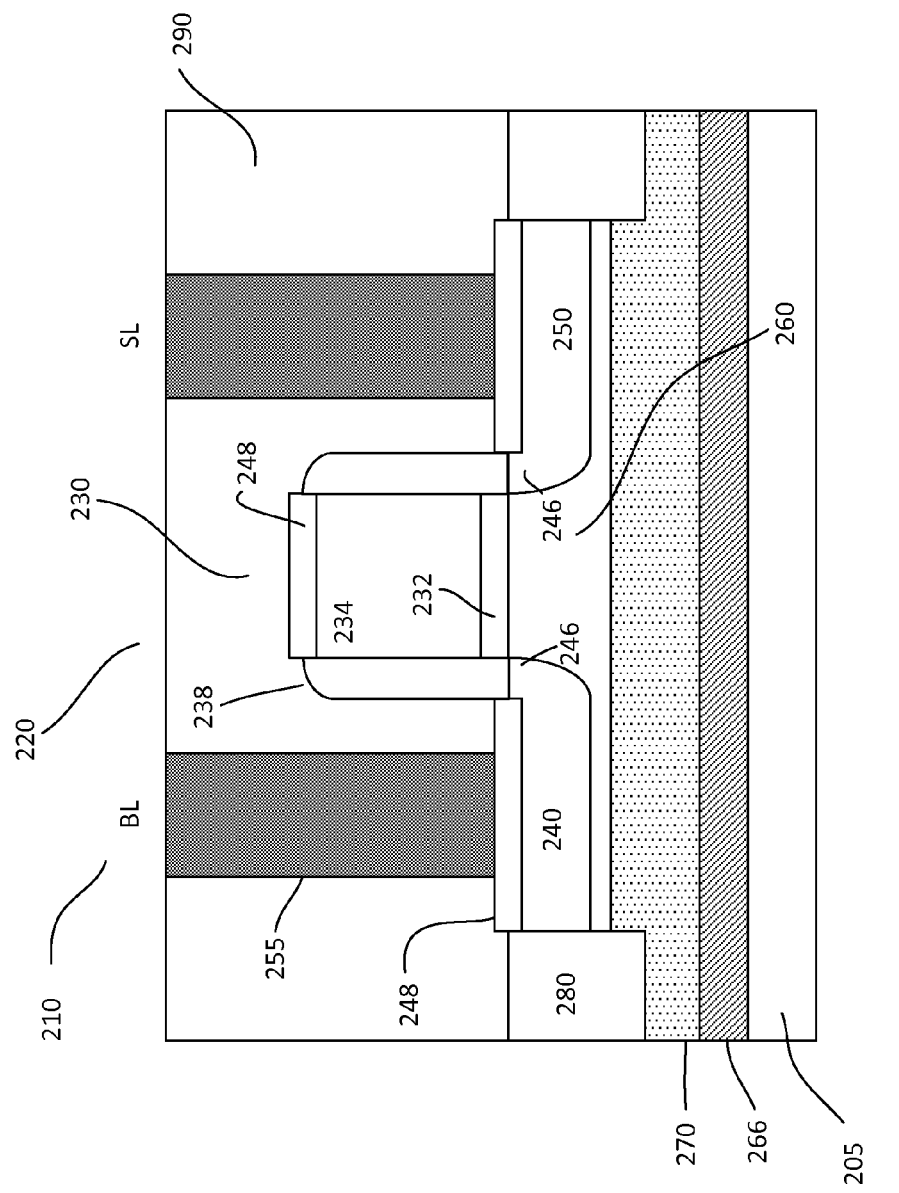
FIGS. 2a-2b show cross-sectional views of various embodiments of a device.
Figure 2B:
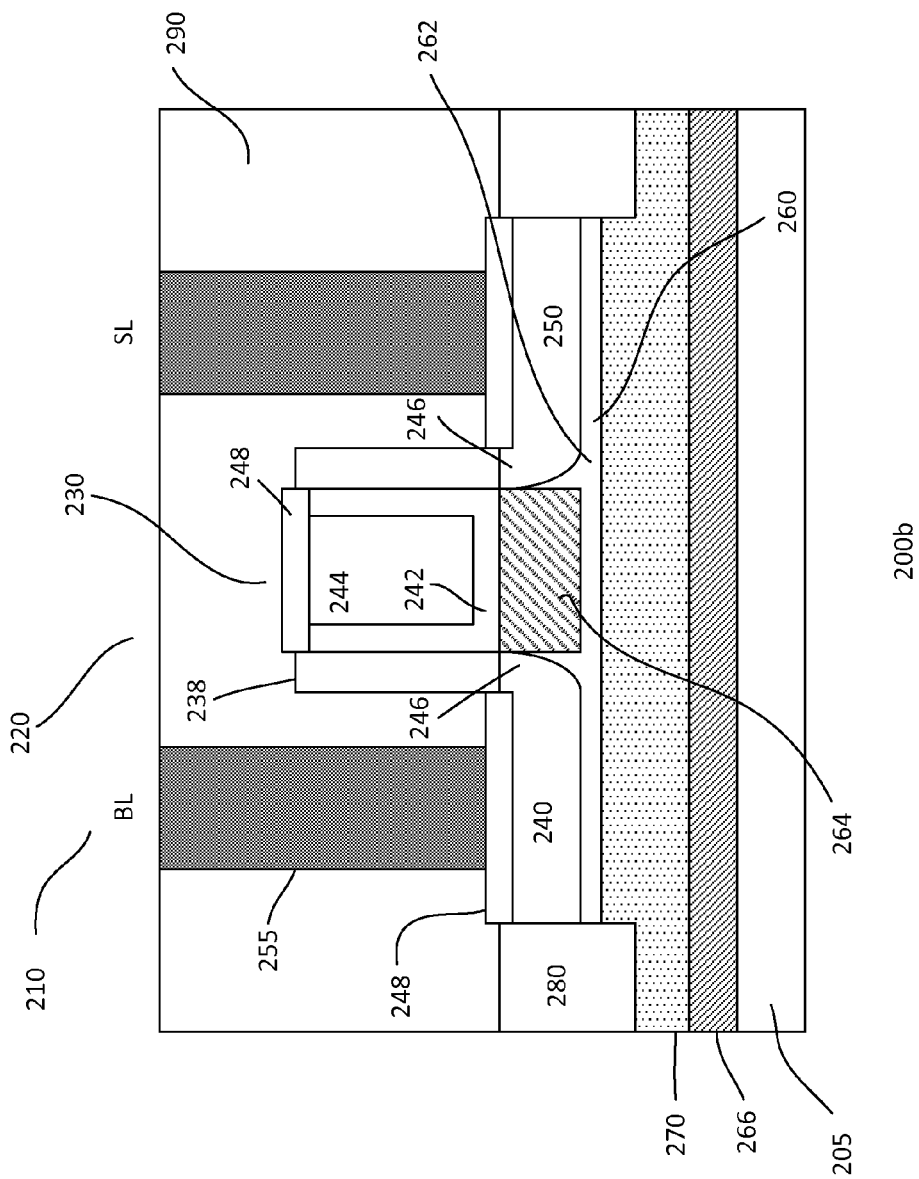

FIGS. 2a-2b show cross-sectional views of various embodiments of a portion of a device. The device, for example, is an IC. Other types of devices may also be useful. The device includes a transistor.

As shown in FIG. 2a, the device 200a includes a substrate 205. The substrate, for example, is a semiconductor substrate, such as a silicon substrate. In one embodiment, the substrate is a p-type doped substrate. For example, the p-type doped substrate is a lightly doped p-type substrate. Other types of semiconductor substrates may also be useful. For example, semiconductor substrates such as silicon germanium, gallium or gallium arsenide may also be useful.

The substrate includes a device region 220. The device region, for example, is surrounded by an isolation region 280. The isolation region may be used to separate the device region from other device regions on the substrate (not shown). The isolation region, for example, is a shallow trench isolation (STI) region. Other types of isolation regions may also be employed. The STI region, for example, extends to a depth of about 2000-5000 Å. Providing STI regions which extend to other depths may also be useful. As shown, the depth of the STI should extend below the top of a buried isolation buffer layer 270.

In one embodiment, the isolation buffer layer 270 is disposed below the substrate surface. The area of the substrate between the isolation buffer layer and substrate surface serves as a body region 260 of a transistor 210. In one embodiment, the substrate between the top of the isolation buffer layer and substrate surface should have a depth sufficient to accommodate the body region. For example, the top of the isolation buffer layer should be about 5-100 nm deep from the surface of the substrate. The thickness of the isolation buffer layer should be sufficient to reduce substrate leakage. The thickness, for example, may be about 5-100 nm. Providing other depths and thicknesses may also be useful. By providing STI which extends below the top of the isolation buffer layer, the body region is floated.

In accordance with an embodiment, the isolation buffer 270 is an amorphized portion of the substrate. For example, in the case of a silicon substrate, the isolation buffer is an amorphized silicon (α-Si) layer of the substrate. In one embodiment, the isolation buffer layer includes amorphizing dopants. The amorphizing dopants, for example, include silicon ions ($Si^+$), germanium (Ge), carbon (C) or a combination thereof. Alternatively, amorphizing dopants such as Ar or O and dopants such as B, P or As implanted by molecular or cluster implants may also be used. Other suitable types of amorphizing dopants may also be employed. The dopants are implanted by, for example, high energy implantation (HEI). The HEI implant is performed at, for example, 160 KeV with a dose of about 5e14-9e14 atom/$cm^2$. Providing other implant energies and doses may also be useful. Implanting the amorphizing dopants by cold, molecular or cluster implantation may also be useful. For example, lower energy requirements of molecular or cluster implantations may also be useful. The implant parameters, such as energy and dose, are tailored to produce isolation buffer layer at the desired location and have the desired effect. By adjusting the energy and dose of the implant, the location and thickness of the isolation buffer can be controlled. This also controls the thickness or height of the substrate surface portion.

A ground plane 266 may optionally be disposed below the isolation buffer layer. The ground plane, for example, may include any suitable types of n-type or p-type dopants. The ground plane serves to bias the substrate. Providing a ground plane enables biasing the substrate with positive or negative bias. Biasing the substrate below the isolation buffer layer may improve retention time. For example, a negative bias may improve retention of holes and reduce charge leakage out to the SL or BL. Depending on the purpose and requirement, the substrate may not be prepared with a ground plane. For example, a ground plane may not be provided in the case where intrinsic retention is sufficient to hold the charge carriers.

As for the transistor 210, it includes a gate 230 disposed on the substrate in the device region 220. The gate, in one embodiment, includes a gate electrode 234 and a gate dielectric 232. The gate dielectric layer, for example, is disposed between the gate electrode and the substrate. The gate electrode, for example, is a polysilicon gate electrode. Other types of gate electrode materials may also be useful. For example, providing a metal gate electrode may also be useful.

Dielectric spacers 238 may be provided on sidewalls of the gate. The dielectric spacers, for example, may be silicon nitride. Other types of dielectric materials may also be used. For example, the spacers may be silicon nitride or multiple layers of dielectric materials, such as silicon oxide and silicon nitride. In other embodiments, no dielectric spacers are provided on the gate sidewalls. The gate, for example, is a gate conductor which serves as a common gate for a plurality of transistors. The gate conductor, for example, is along a first direction.

As for the body 260 of the transistor, it includes second polarity type dopants. For example, the second polarity type dopants are for a first polarity type transistor. In one embodiment, the body is lightly or intermediately doped with second polarity type dopants. For example, in the case where first polarity type is n-type, the body may be a lightly or intermediately doped p-type substrate. Other dopant concentrations may also be useful. In the case where the body is doped differently from the substrate, a second polarity type lightly doped region may be provided, such as by implantation. Other configurations of the body may also be useful.

First and second diffusion or source/drain (S/D) regions 240 and 250 are disposed in the substrate in the body region adjacent to first and second sides of the gate. In one embodiment, the S/D regions include first polarity type dopants for a first polarity type transistor. For example, the S/D regions may be doped with n-type dopants for a n-type transistor, such as a n-type metal oxide semiconductor (nMOS) transistor. The S/D regions, in one embodiment, are heavily doped first polarity type region. For example, the dopant concentration of the S/D regions may be about $10^{18}$-$10^{20}$ atom/cm$^3$. As shown, the depth or bottom of the S/D regions is shallower than the isolation buffer layer. For example, the body region 260 separates the S/D regions from the isolation buffer. Providing S/D regions which abuts the isolation buffer layer or extend into the isolation buffer layer may also be useful. Other suitable depths for the S/D regions may also be useful.

In some embodiments, the S/D regions may be provided with S/D extension regions 246. The S/D extension regions may be lightly doped portions of the S/D regions. The dopant concentration of the S/D extension regions may be about, for example, 1e17-1e20 cm$^{-3}$. Other suitable dopant concentrations for the S/D extension regions may also be useful. The S/D extension regions, for example, extend beneath the spacers to connect the channel to the S/D regions. In some embodiments, the S/D extension profile may extend beneath the gate. Providing a S/D extension profile which underlaps the gate may increase resistance and have better short channel effect. The spacers facilitate forming the S/D extension regions. For example, S/D extension regions are formed prior to forming spacers while S/D regions are formed after.

In one embodiment, metal silicide contacts 248 are formed on the contact or terminal regions of the transistor. For example, silicide contacts are disposed on the gate electrode and S/D regions. The metal silicide contacts may be nickel-based silicide contacts. Other types of silicide contacts may also be useful. The contacts may be about 100-500 Å thick. Other thickness of contacts may also be useful. The silicide contacts may be employed to reduce contact resistance and facilitate contact to the back-end-of-line (BEOL) metal interconnects.

A dielectric layer 290 is disposed over the transistor. The dielectric layer, for example, serves as a pre-metal dielectric (PMD) layer. The dielectric layer may be a silicon oxide dielectric layer. Other types of dielectric layers may also be useful. For example, the dielectric layer may be a high aspect ratio process (HARP) dielectric layer. Via contacts 255 may be provided in the dielectric layer to connect to the terminals of the transistor. For example, first S/D via contact connecting to the first S/D region and second S/D via contact connecting to the second S/D region may be provided. A gate terminal contact (not shown), which connects to the gate, may also be provided. In one embodiment, the first S/D is coupled to a BL, the second S/D is coupled to a SL and the gate is coupled to a WL, forming a 1T-SRAM cell.

As described, the isolation buffer is an amorphized portion of the substrate. Providing an amorphized portion of the substrate improves the floating body of the transistor. For example, this enables better retention time, reduced charge leakage and avoids the use of silicon-on-insulator substrate which is relatively costly, thereby lowering the manufacturing costs.

FIG. 2b shows another embodiment of a portion of a device 200b. The device is similar to that described in FIG. 2a. Common elements may not be described or described in detail. As shown, the gate is a high-k metal gate. For example, the gate electrode 244 may be a metal gate electrode, such as TaN or TiN. As for the gate dielectric layer 242, it may be a high-k gate dielectric, such as HfSiON, SiON or HfO$_2$. Other suitable types of gate dielectrics may also be useful. In some embodiments, the gate dielectric may further include a work function tuning layer. For example, La$_2$O$_3$ may be provided for an n-type device while TiN/Al/TiN may be provided for a p-type device in addition to HfSiON and/or HfO$_2$. Other configurations of gates may also be useful. The gate, for example, may include a composite gate electrode having multiple gate electrode layers, a composite gate dielectric layer having multiple gate dielectric layers, or a combination thereof. As shown, the gate dielectric surrounds sides and bottom of the gate electrode. For example, such a configuration may result from a gate-last process to form the transistor.

In one embodiment, the body 260 of the transistor includes a band engineered (BE) floating body. In one embodiment, the floating body includes a BE portion 264. The BE portion is disposed in the body below the gate and between the S/D regions. As shown, the BE portion has a depth equal to about the depth of the S/D regions, leaving a gap in between the BE portion and the isolation buffer. The gap, for example, may prevent charge carriers from leaking out. Other suitable depths or configuration of the BE portion may also be useful. The BE portion, in one embodiment, is a silicon germanium (SiGe) BE portion. The BE portion, for example, may be lightly doped with second polarity type dopants. Other suitable types of BE portions may also be useful. For applications with BE portion, the body may be Si:C. For example, the body may be doped with C dopants. The concentration of C may be about, for example, 1-3%. Other techniques for providing a Si:C body may also be useful. For example, the body may be an epitaxial Si:C body. The epitaxial body may be in-situ doped. Implanting the epitaxial body may also be useful. For applications without a BE portion, S/D regions may be doped with C dopants. For example, Si:C S/D regions may be disposed within a Si body.

As described, a BE portion is provided along with the amorphized isolation buffer layer. The BE portion reduces operating voltage of the device. Furthermore, improved read/write speed can be achieved along with improved retention time. Also, the BE portion enables non-destructive read operations.

Figure 3A:
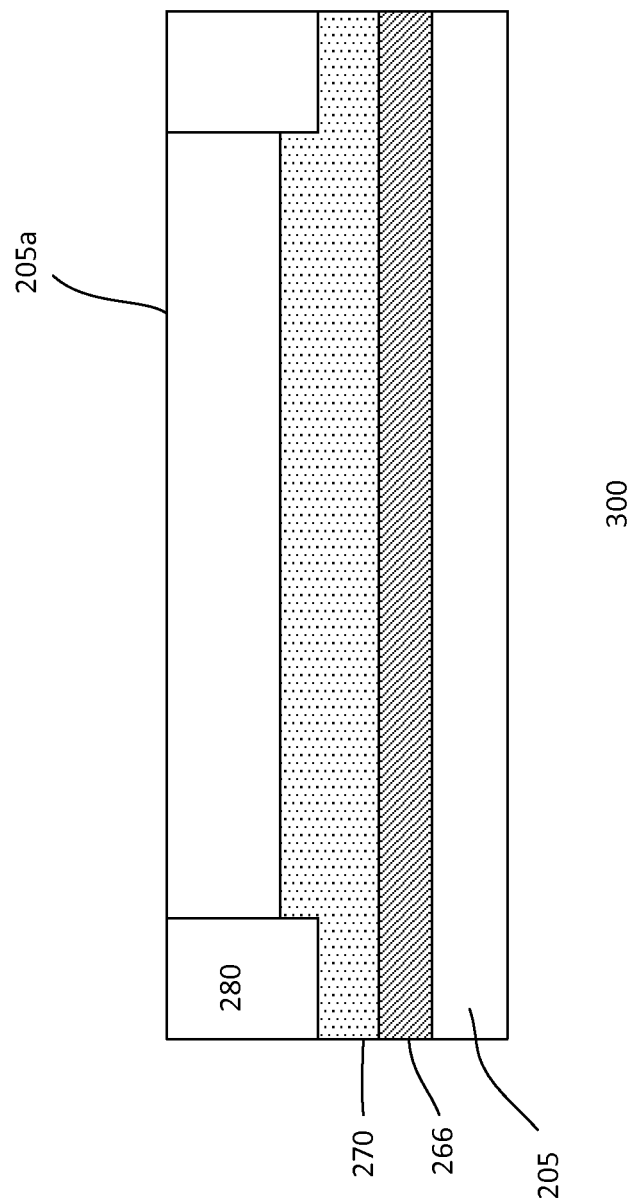
FIGS. 3a-3e show cross-sectional views of a process for forming an embodiment of a device.

FIGS. 3a-3e show cross-sectional views of an embodiment of a process for forming a portion of a device or IC. Referring to FIG. 3a, a substrate 205 is provided. The substrate serves as a base for the device 300. The substrate, for example, is a semiconductor substrate, such as a silicon substrate. In one embodiment, the substrate is a p-type doped substrate. For example, the p-type doped substrate is a lightly doped p-type substrate. Other suitable types of semiconductor substrates may also be useful.

The substrate includes a device region. The device region, in one embodiment, serves as a cell region for a memory cell. In one embodiment, the cell region serves as a device region of a 1T-SRAM cell. Isolation regions 280 are formed in the substrate 205. The isolation region serves to isolate the cell region from other device regions (not shown). The isolation region, for example, is a shallow trench isolation (STI) region. Other types of isolation regions may also be useful. The STI region, for example, extends to a depth of about 2000-5000 Å. Providing STI regions which extend to other depths may also be useful. As shown the depth of the STI should extend below a buried isolation buffer layer 270. Various processes can be employed to form the STI region. For example, the substrate can be etched using etch and mask techniques to form trenches which are then filled with dielectric materials such as silicon oxide. Chemical mechanical polishing (CMP) can be performed to remove excess oxide and provide a planar top surface. Other processes or materials can also be used to form the STI.

As shown, the substrate includes one device region. It is, however, understood that the substrate may include a plurality of device regions. For example, numerous cell regions may be provided in an array region to form a plurality of memory cells. In some cases, one memory cell may occupy one cell region. For example, an isolation region may surround a cell region. Other configurations of memory cells, device regions, and isolation regions may also be useful. For example, isolation regions may be used to isolate BLs of adjacent memory cells and adjacent gates of adjacent rows. In such a case, isolation regions may be provided to partially surround the cell region on all sides of the cell but does not completely surround it.

The process continues to form a buried isolation buffer layer 270. In accordance with an embodiment, the isolation buffer is an amorphized portion of the substrate 205. For example, in the case of a silicon substrate, the isolation buffer is an amorphized silicon ($\alpha$-Si) layer. In one embodiment, amorphizing dopants are implanted into the substrate. The amorphizing dopants, for example, include silicon ions ($Si^+$), germanium (Ge) or carbon (C) or a combination thereof. Alternatively, amorphizing dopants such as Ar or O and dopants such as B, P or As implanted by molecular or cluster implants may also be used. Other suitable types of amorphizing dopants may also be employed. The amorphizing dopants are implanted by, for example, high energy implantation (HEI). The HEI implant is performed at, for example, 160 KeV with a dose of about 5e14-9e14 atom/$cm^2$. Providing other suitable implant energies and doses may also be useful. Implanting the amorphizing ions by cold, molecular, or cluster implantation may also be useful. For example, lower energy requirements of molecular or cluster implantations may also be useful. The implant parameters, such as energy and dose, are tailored to produce isolation buffer layer at the desired location and have the desired effect. By adjusting the energy and dose of the implant, the location and thickness of the isolation buffer can be controlled. This also controls the thickness or height of the substrate surface.

An anneal may be performed after implanting the amorphizing dopants. The anneal, for example, includes laser anneal, rapid thermal anneal (RTA) or furnace anneal. Other suitable types of anneal technique may also be useful. Alternatively, amorphizing dopants may be activated during well or S/D region anneal process. In one embodiment, the top of the isolation buffer should have a depth sufficient to accommodate a body region of the transistor. For example, the top of the isolation buffer should be about 5-100 nm deep from the top surface 205a of the substrate. The thickness of the isolation buffer should be sufficient to reduce substrate leakage. The thickness, for example, may be about 5-100 nm. Providing other suitable depths and thicknesses may also be useful.

In another embodiment, a ground plane 266 may optionally be formed in the substrate. In this case, the buried isolation buffer layer 270 is formed over the ground plane. The ground plane, for example, is formed by implanting any suitable types of n-type or p-type dopants. P-type dopants can include boron (B), aluminum (Al), indium (In) or a combination thereof while n-type dopants can include phosphorus (P), arsenic (As), antimony (Sb) or a combination thereof. The implant parameters, such as energy and dose, are tailored to produce ground plane at the desired location and have the desired effect. By adjusting the energy and dose of the implant, the location and thickness of the ground plane can be controlled. The thickness of the ground plane layer is, for example, 5-100 nm. The ground plane may be formed after forming the isolation buffer layer. Alternatively, the ground plane layer may be formed over the substrate by an epitaxial process. In this case, the ground plane layer may be formed prior to forming the buried isolation buffer layer. Other suitable techniques for forming the ground plane layer may also be useful. Providing a ground plane enables biasing the substrate with a positive or negative charge bias. Biasing the substrate below the isolation buffer may improve retention time. For example, a negative substrate bias may improve retention of holes and reduce charge leakage out to SL or BL. Depending on the purpose and requirement, the substrate may not be prepared with a ground plane. For example, a ground plane may not be provided in the case where intrinsic retention is sufficient to hold the charge carriers.

Figure 3B:
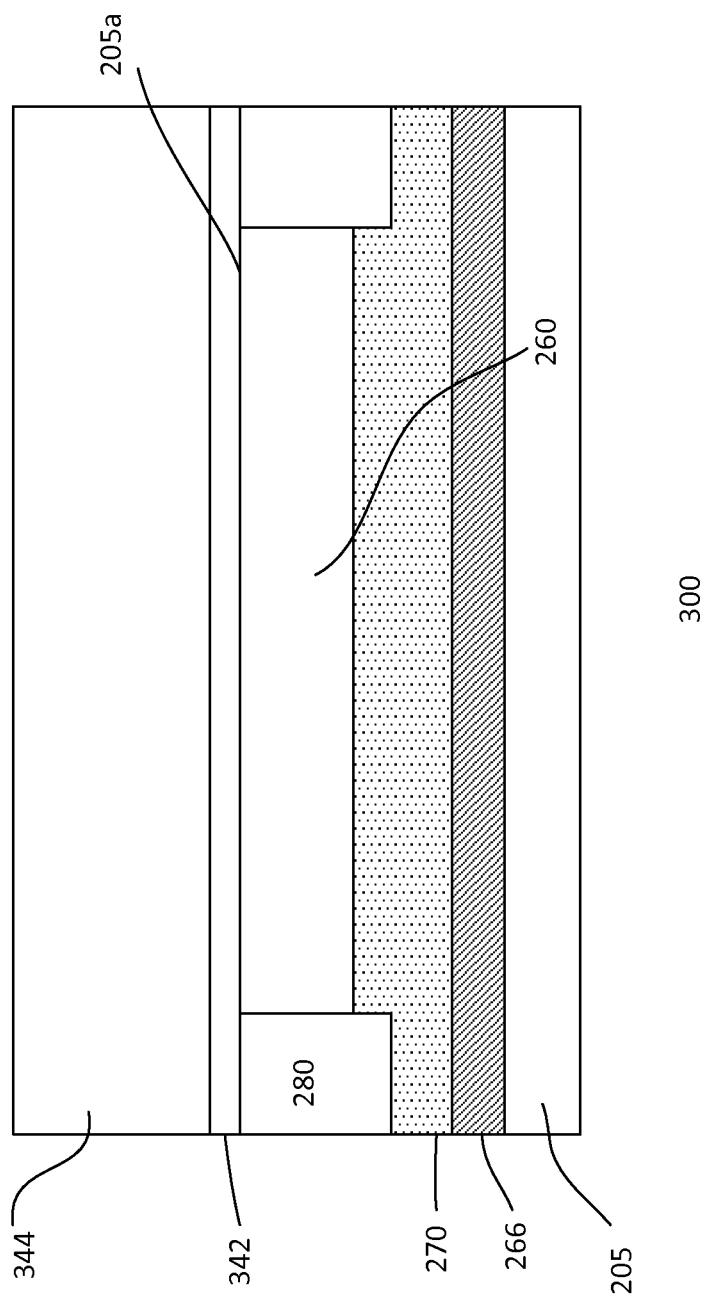

Referring to FIG. 3b, the area of the substrate between the top surface of the isolation buffer layer 270, the isolation regions 280 and substrate top surface 205a serves as a floating body region 260. For example, this area serves as a floating transistor body. The floating body region, for example, may have the same doping as the substrate. For example, the floating body region is a lightly doped p-type region. Other dopant type may also be useful.

The process continues to form a gate dielectric layer 342 and a gate electrode layer 344 over the top surface of the substrate. The gate dielectric layer, for example, includes silicon oxide ($SiO_2$). Alternatively, it may be a high-k gate dielectric layer, such as HfSiON, SiON or $HfO_2$. Other suitable types of dielectric materials may be useful. The dielectric layer is formed by, for example, thermal oxidation, chemical vapor deposition (CVD) or atomic layer deposition (ALD). The thickness of the dielectric layer, for example, may be about 1-50 nm, depending on the k-value. Other suitable techniques for forming or other thickness ranges may also be useful for the gate dielectric layer. The gate electrode layer, for example, includes polysilicon, metal or metal nitride. Various suitable types of metal, such as Ru, W, Pt, TiN, Ti, Zr, TaN, Si or Al, can be used. Other suitable types of metals may also be useful. The thickness of the gate electrode can be about 10-200 nm. Various techniques can be used to form the gate electrode layer. For example, polysilicon can be deposited by CVD while metal can be deposited by sputtering. Other suitable techniques for forming and other suitable thickness dimensions for the gate electrode layer may also be useful.

In some embodiments, the gate dielectric may further include a work function tuning layer formed in between the gate dielectric and the metal gate electrode layer. For example, $La_2O_3$ may be formed for an n-type device while TiN/Al/TiN may be formed for a p-type device in addition to HfSiON and/or $HfO_2$. Other configurations of gates may also be useful. The gate, for example, may include a composite gate electrode having multiple gate electrode layers, a composite gate dielectric layer having multiple gate dielectric layers, or a combination thereof.

Figure 3C:
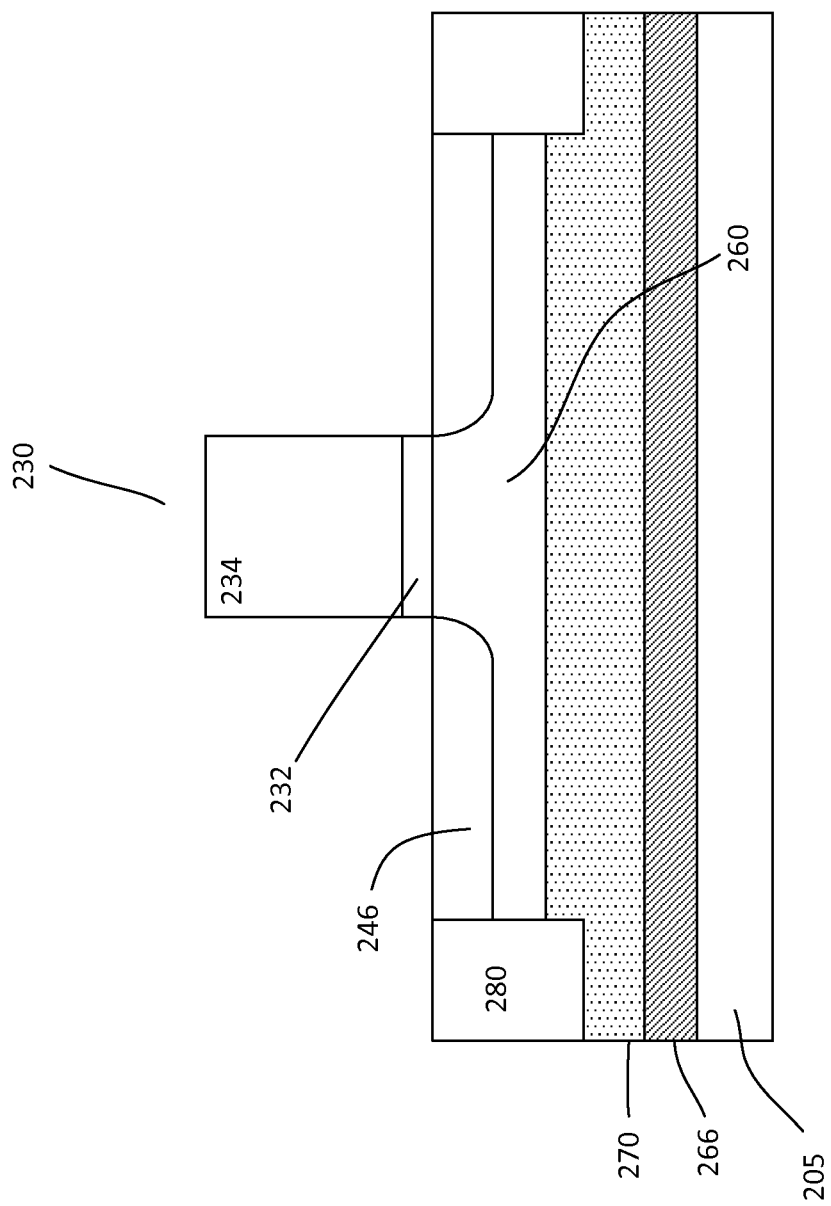

Referring to FIG. 3c, the gate layers are processed to form a gate 230 having a patterned gate dielectric 232 and gate electrode 234. In one embodiment, the gate layers are patterned to form a gate conductor. The gate conductor may traverse other cell regions. In other embodiments, the gate layers are patterned to form an individual gate in the cell region. The patterning of the gate layers can be achieved, for example, by mask and etch techniques. For example, a patterned photoresist mask may be used as an etch mask for an anisotropic etch, such as a reactive ion etch (RIE). To improve lithographic resolution, an ARC can be provided beneath the photoresist. Other techniques for patterning the gate layers may also be useful. After patterning the gate layers, the mask, including the ARC layer, may be removed.

The process continues to form lightly doped regions 246 in the floating body region 260 adjacent to first and second sides of the gate. The lightly doped region has first polarity type dopants. To form the lightly doped region, first polarity type dopants are implanted into the substrate. The implant, for example, may be self-aligned with respect to the gate 230. For example, the implant may dope the substrate unprotected by the gate and isolation region 280. The depth of the lightly doped region, for example, is about 5-50 nm. Other suitable depth dimensions may also be useful, depending on technology node. For example, providing lightly doped regions which abuts the isolation buffer may also be useful. The implant dose may be about 1e14-3e15 $cm^{-2}$. Other suitable implant parameters may also be useful. An implant mask which exposes the device region may be provided to perform the implant. The implant mask, for example, may be a photoresist layer. Other suitable types of implant masks may also be useful.

Sidewall spacers 238 may be formed over the first and second gate sidewalls. To form the sidewall spacers 238, a spacer layer is deposited on the substrate. The spacer layer, for example, may be silicon nitride. Other suitable types of dielectric material, such as silicon oxide or silicon oxynitride may also be used. The spacer layer may be formed by CVD. The spacer layer may also be formed using other techniques. The thickness of the spacer layer may be about, for example, 5-50 nm. Other thickness ranges may also be useful. The thickness, for example, may depend on the desired width of the spacers. An anisotropic etch, such as RIE, may be performed to remove horizontal portions of the spacer layer, leaving spacers 238 on the sidewalls of the gate as shown in FIG. 3d.

Figure 3D:
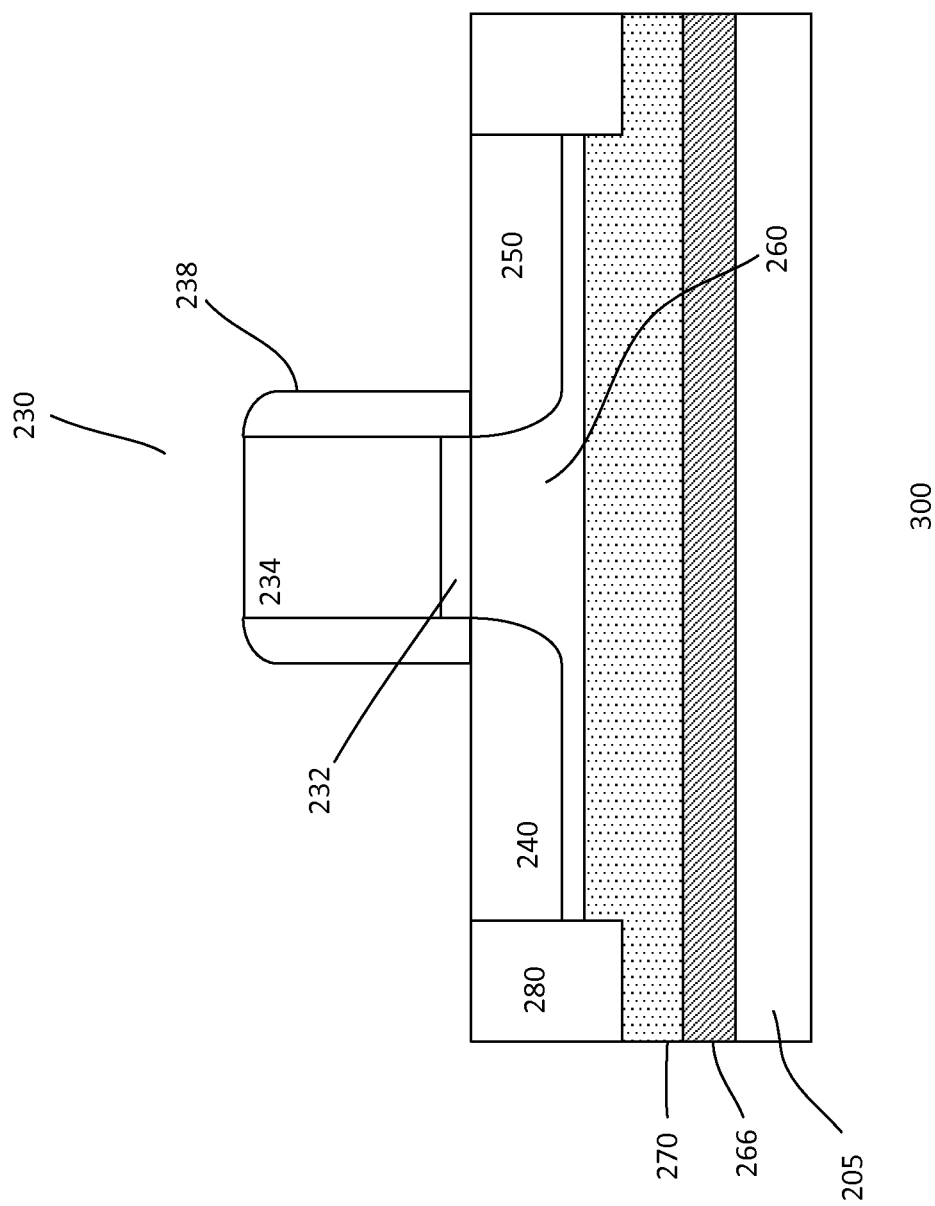

Referring to FIG. 3d, first and second S/D regions 240 and 250 are formed in the substrate. The first and second S/D regions, for example, are heavily doped region. The heavily doped regions, in one embodiment, are formed adjacent to the first and second sides of the gate. The heavily doped regions have first polarity type dopants. Forming the heavily doped regions includes implanting first polarity type dopants into the substrate. The implant, like the one that forms the lightly doped regions, is self-aligned with respect to the device region. For example, the dopants may be doped into the substrate unprotected by the gate, sidewall spacers 238 and isolation region 280. In this case, the sidewall spacers 238 caused the heavily doped regions to be offset, creating first and second S/D region which includes lightly doped regions 246 and heavily doped deeper portions 240 and 250. The depth of the heavily doped regions, for example, is about 5-50 nm. The implant dose, for example, may be about 1e15-5e15 $cm^{-2}$. Other suitable implant parameters may also be useful. The implantation parameters, for example, are selected to form S/D regions having a depth shallower than the isolation buffer layer. For example, as shown in FIG. 3d, the body region separates the S/D regions from the isolation buffer. Providing S/D regions which abuts the isolation buffer may also be useful. Other configurations for the S/D regions may also be useful.

Figure 3E:
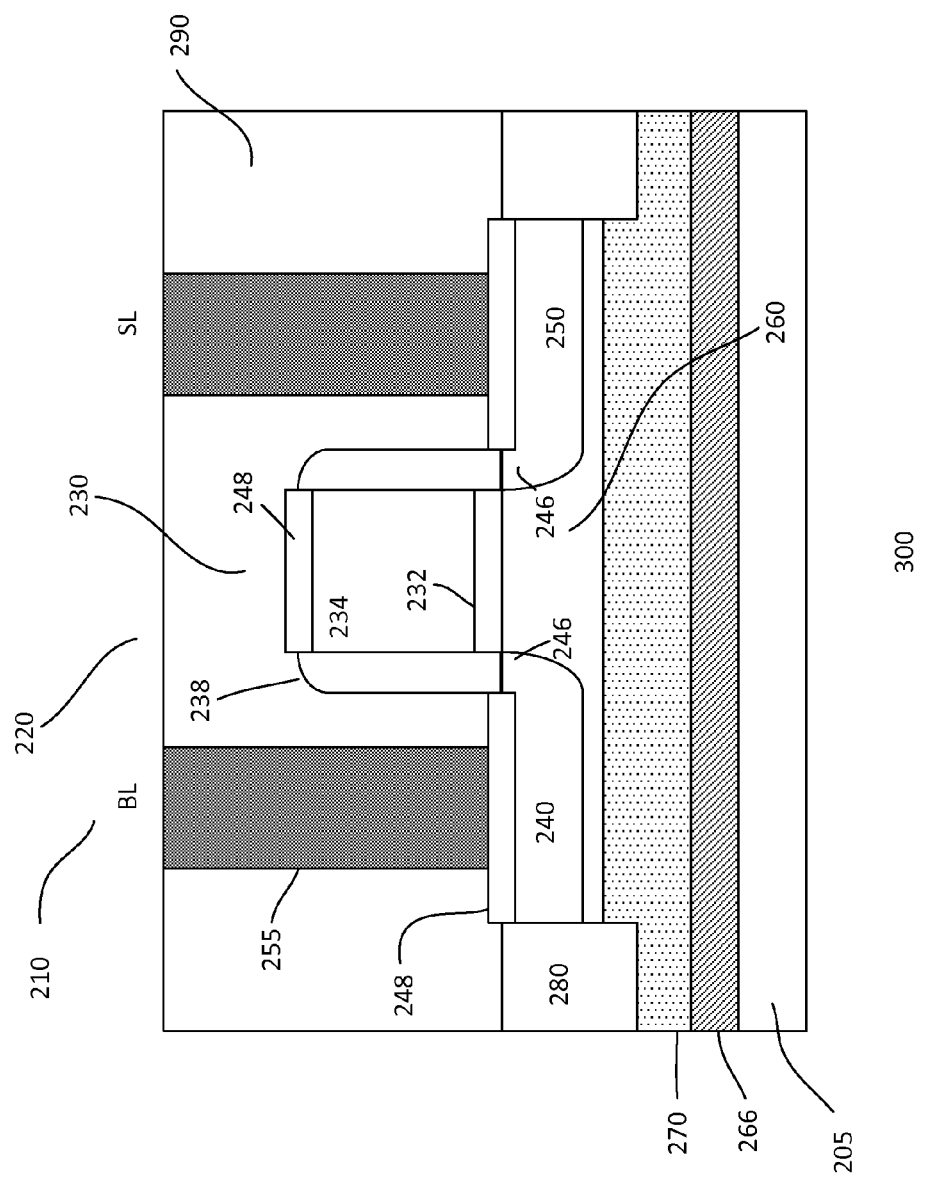

The process may continue to complete the memory cell until a memory cell shown in FIG. 3e which is the same as FIG. 2a is formed. For example, metal silicide contacts 248 may be formed on the gate electrode 234 and first and second S/D regions 240 and 250. The metal silicide contacts, for example, may be nickel-based metal silicide contacts. Other types of metal silicide contacts may also be useful. The metal silicide contacts facilitate reduced contact resistance. To form silicide contacts, a metal layer may be deposited over the substrate and annealed to cause a reaction with silicon. Unreacted metal is removed by, for example, a wet etch, leaving the silicide contacts on the gate electrode the source region.

Referring to FIG. 3e, a dielectric layer 290 is formed over the substrate, covering the memory cell. The dielectric layer, for example, is a silicon oxide layer. The dielectric layer may be a high aspect ratio process (HARP) dielectric layer. Other types of dielectric materials including BPSG, PSG, USG, TEOS oxide, PEOX, HDP oxide, etc., may also be useful. The dielectric layer, for example, may be formed by CVD. Other suitable techniques may also be useful. The dielectric layer serves as a contact or pre-metal dielectric layer in which contacts 255 are formed to contact regions of the substrate.

To form contacts 255, a soft mask (not shown) may be used to form via or contact openings to the contact regions. The soft mask, for example, is a photoresist mask. To improve lithographic resolution, an anti-reflective coating (ARC) may be provided between the dielectric layer and soft mask. The soft mask is patterned to form openings corresponding to the contact regions. A conductive layer is then formed on the substrate, filling the openings and covering the dielectric layer 290. A planarizing process, such as CMP, removes excess conductive layer, forming contacts 255 having a planar surface with the top surface of the dielectric layer 290. Other techniques for forming contacts may also be useful. The contact 255 over the first S/D region is a bitline (BL) contact; the contact 255 over the second S/D region is a source line (SL) contact while contact coupled to the wordline is not shown in FIG. 3e.

The process may continue to complete the memory cell. For example, BEOL process including interconnect metal levels may be provided to form interconnections to the terminals of the transistor and other circuit components, as desired. Other processes may also be included to complete the memory cell or device, for example, final passivation, dicing and packaging.

Figure 4A:
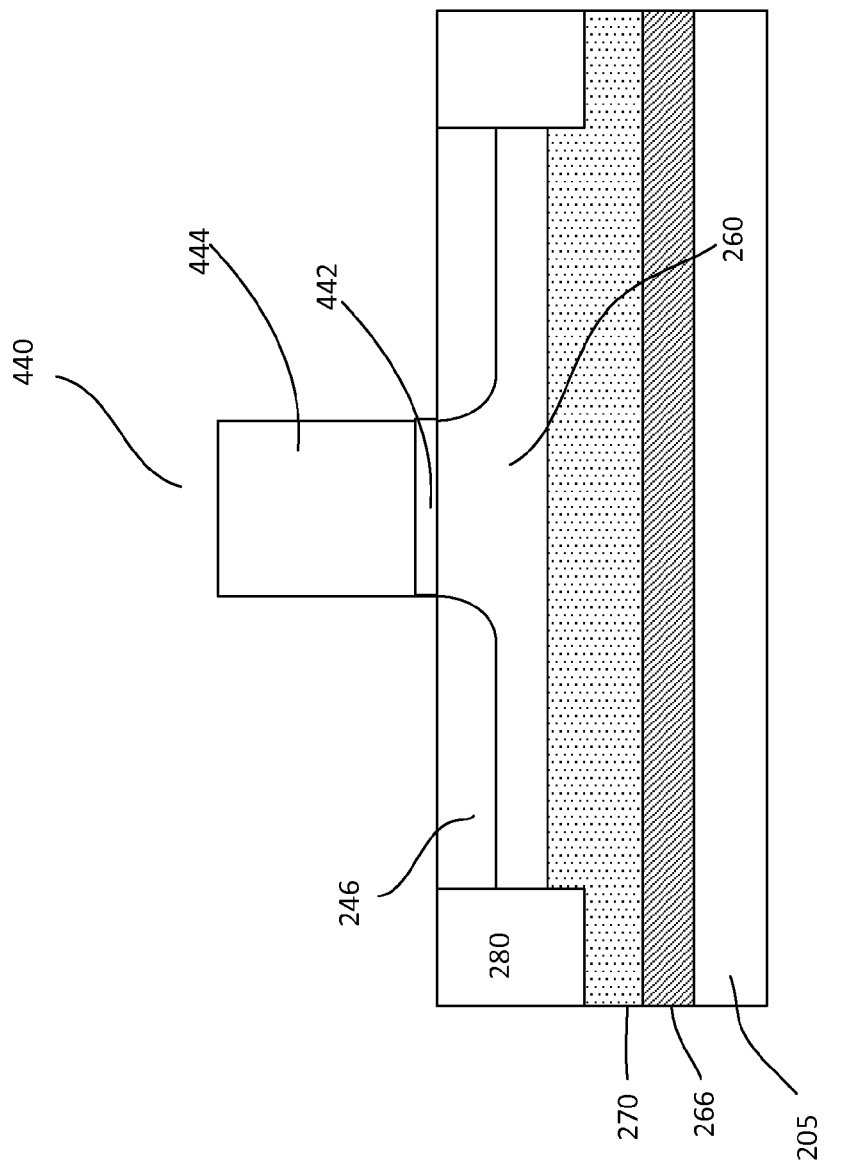
FIGS. 4a-4e show cross-sectional views of a process for forming another embodiment of a device.

FIGS. 4a-4e show cross-sectional views of a process for forming another embodiment of a device 400. The process may contain similar steps as that described in FIGS. 3a-3e. In the interest of brevity, common elements may not be described or described in detail. As shown in FIG. 4a, the partially processed substrate is at the stage similar to that described in FIG. 3c.

Referring to FIG. 4a, a dummy gate structure 440 is formed over the substrate. The dummy gate structure, as shown, includes a dummy gate dielectric 442 and dummy gate electrode 444. The dummy gate electrode, for example, includes polysilicon and the dummy gate dielectric, for example, includes silicon oxide. Various other suitable materials and techniques may be employed to form the dummy layer. For example, the dummy gate structure should include materials which can be removed or etched selectively to layers below or around it, such as spacers or dielectric layer as will be describe later. The dummy gate layers may be formed by, for example, CVD covering the device region. Other techniques, such as sputtering or spin coating may also be useful, depending on the material of the dummy layers. The thickness of the dummy gate electrode, for example, may be about 10-200 nm. Other suitable thickness dimensions may also be useful.

Similar to that described in FIG. 3c, first and second S/D extension regions 246 may be formed in the floating body regions adjacent to first and second sides of the dummy gate structure. As such, details of the S/D extension regions will not be described.

Figure 4B:
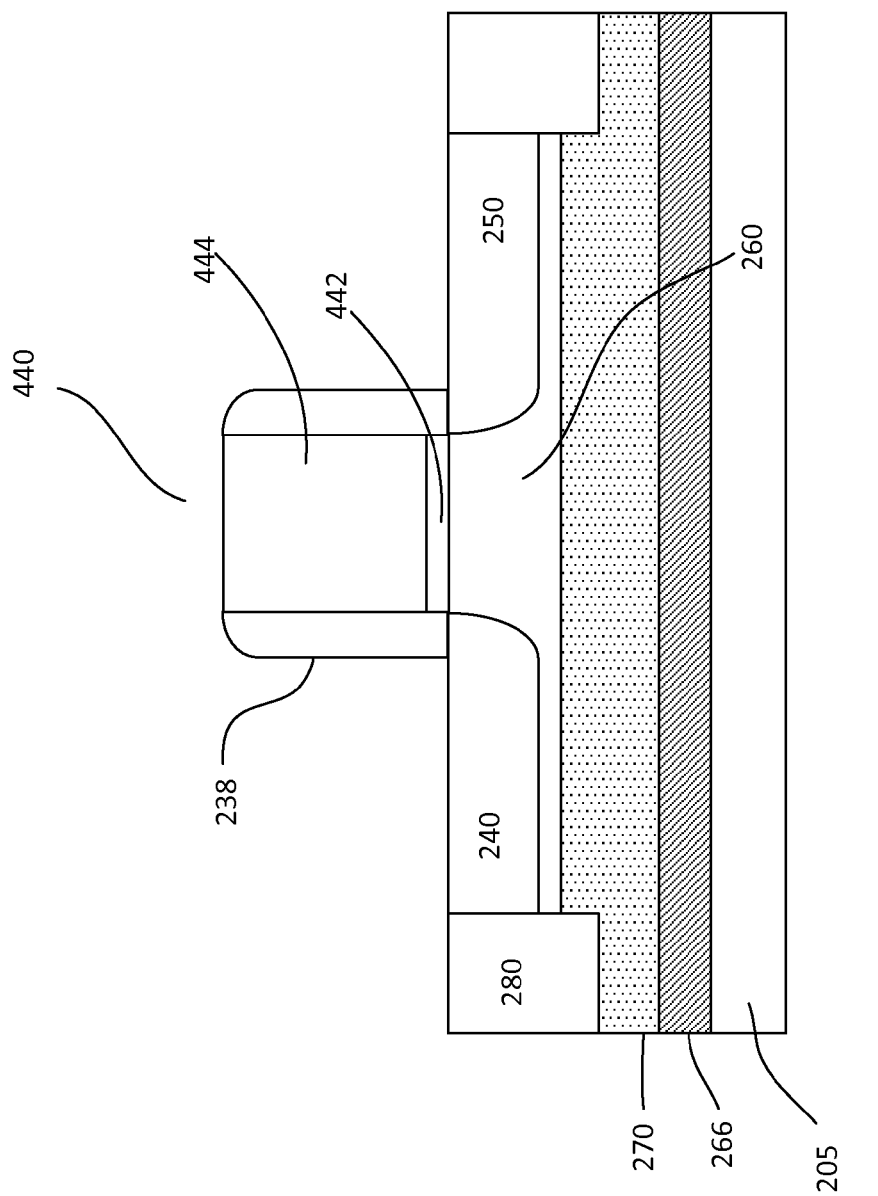

Referring to FIG. 4b, the process continues to form first and second sidewall spacers 238 and first and second S/D regions 240 and 250. The sidewall spacers 238 are formed on the first and second sides of the dummy gate structure 440. The gate sidewall spacers 238, for example, include silicon nitride. Other suitable types of spacer materials, such as silicon oxide or silicon oxynitride, may also be useful. The first and second S/D regions 240 and 250 are formed in the substrate adjacent to the dummy gate structure. The first and second S/D regions are formed in the floating body region 260. Techniques for forming the sidewall spacers and S/D regions are the same as that described in FIG. 3d. Other suitable techniques may also be useful.

Figure 4C:
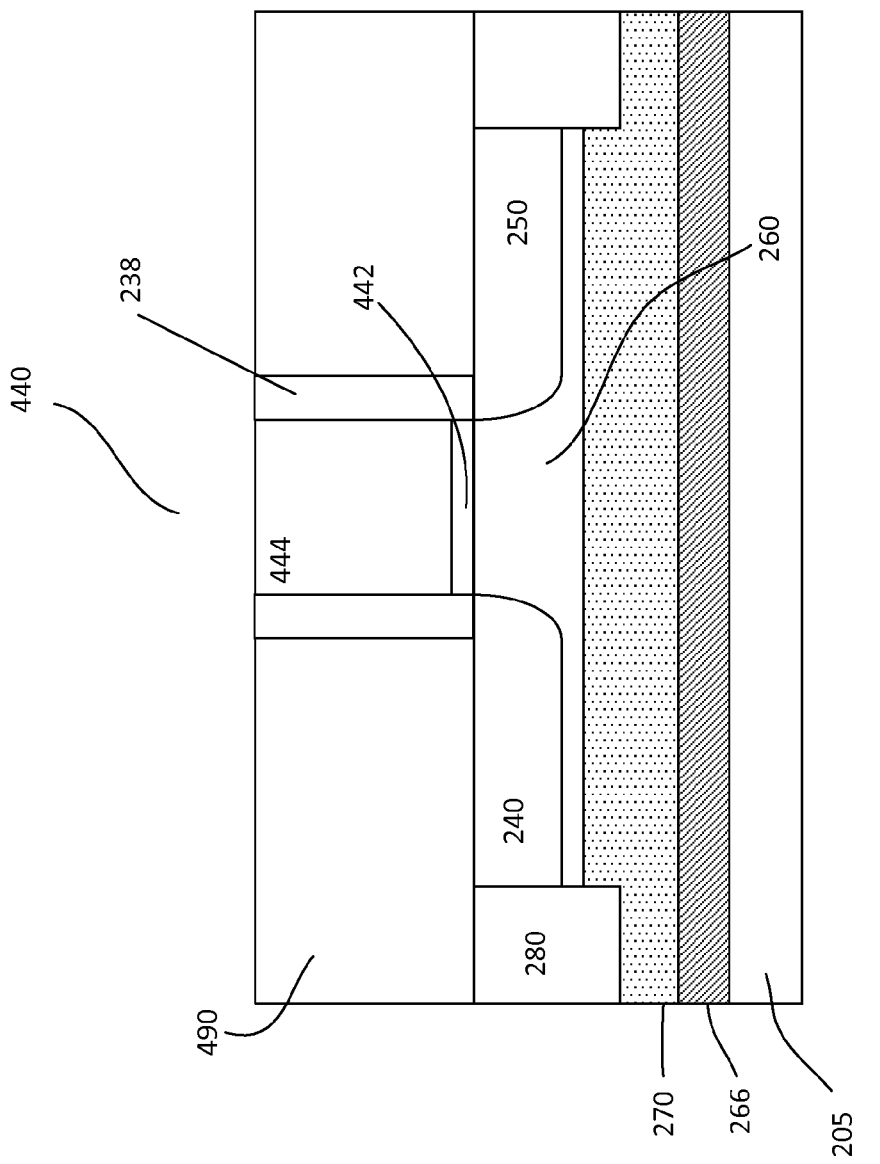

The process continues to form an interlevel dielectric (ILD) layer 490. Referring to FIG. 4c, a dielectric layer is deposited on the substrate, over the S/D regions 240 and 250, isolation regions 280 and dummy gate 440. The dielectric layer may be a silicon oxide. Other types of dielectric material may also be useful. Preferably, the ILD 490 is formed of a material which the dummy gate may be selectively removed to the ILD layer. The dielectric layer, for example, may be formed by CVD. Other suitable techniques may also be useful. Excess dielectric material of the ILD layer is removed by planarization process, such as CMP. Other types of planarization processes may also be useful. The CMP, for example, may use the dummy gate structure as a CMP stop. For example, the CMP forms a substantially coplanar surface between the top surface of the dummy gate, sidewall spacers and ILD layer.

Figure 4D:
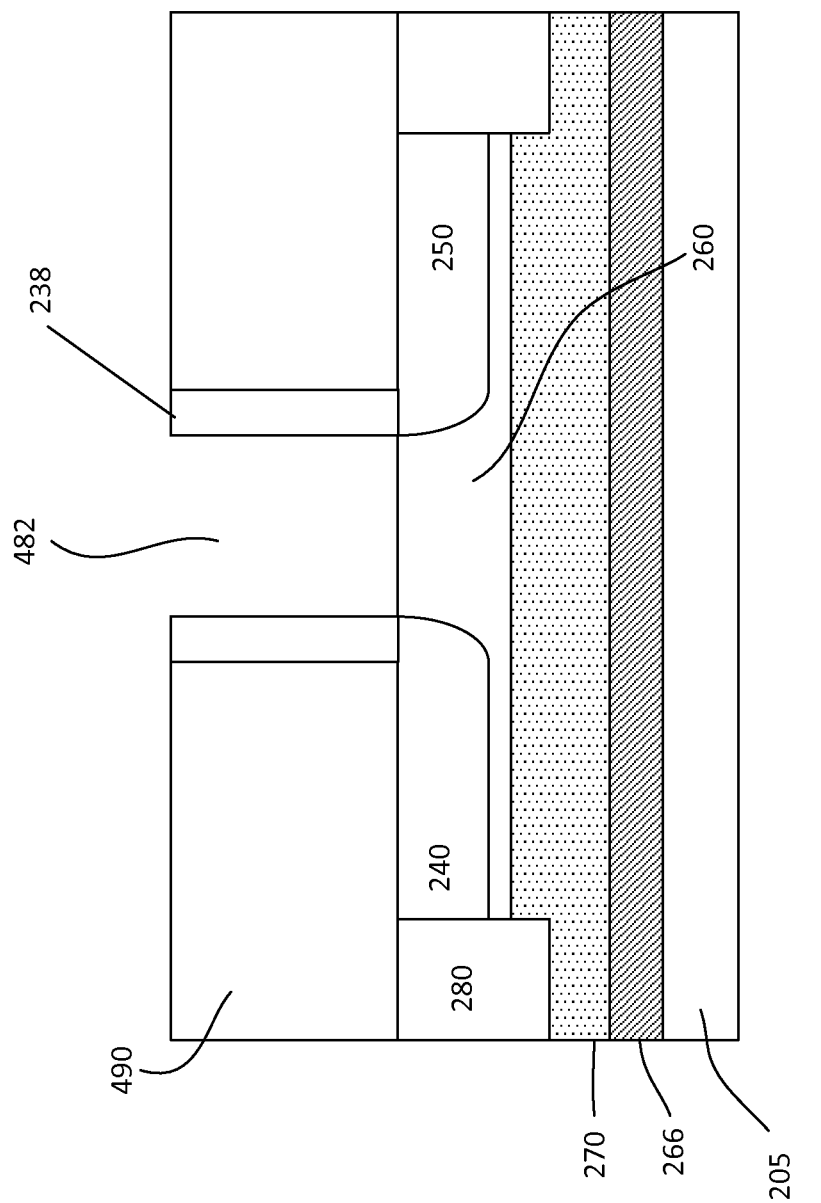

Referring to FIG. 4d, the dummy gate structure 440 is removed. A dual etch process using different chemistries, for example, may be employed to remove the dummy gate electrode and the dummy gate dielectric. For example, a dry etch followed by a wet etch/clean process are performed to remove the dummy gate electrode 444 by etch selectivity control of the dummy gate to the dielectric layer 490 and spacers 238. As for the removal of the dummy gate dielectric layer 442, in one embodiment, it is removed by reactive ion etch (RIE). Other suitable techniques for removing the dummy gate structure may also be useful. The removal of the dummy gate structure forms a gate opening 482 which exposes sides of the spacers 238 which are away from the ILD 490 as shown.

The process continues by forming a high-k metal gate structure. The high-k metal gate structure includes a gate dielectric 242 and a gate electrode 244. The gate dielectric, for example, includes high-k dielectric material, such as HfSiON, SiON or HfO$_2$. Other suitable types of dielectric materials may be useful. The thickness of the dielectric layer, for example, may be about 1-5 nm. The gate electrode layer, for example, includes metal or metal nitride. Various suitable types of metal, such as Ru, W, Pt, TiN, Ti, Zr, TaN, Si or Al, can be used. Other suitable types of metals may also be useful. The thickness of the gate electrode can be about 10-200 nm. Other suitable thickness dimensions for the gate dielectric and electrode layers may also be useful.

In some embodiments, a work function tuning layer may be formed in between the gate dielectric and the metal gate electrode layer. For example, La$_2$O$_3$ may be formed for an n-type device while TiN/Al/TiN may be formed for a p-type device in addition to HfSiON and/or HfO$_2$. Other configurations of gates may also be useful.

The gate dielectric and gate electrode layers are conformally formed on the substrate. For example, the gate dielectric layer lines the ILD, exposed sides of the sidewall spacers 238 and the exposed portion of the substrate while the gate electrode layer covers the gate dielectric layer and fills the gate opening 482. The gate dielectric layer may be formed by, for example, atomic layer deposition technique while the gate electrode layer is formed by sputtering or CVD. Forming the gate dielectric and gate electrode layers by other techniques may also be useful.

Figure 4E:
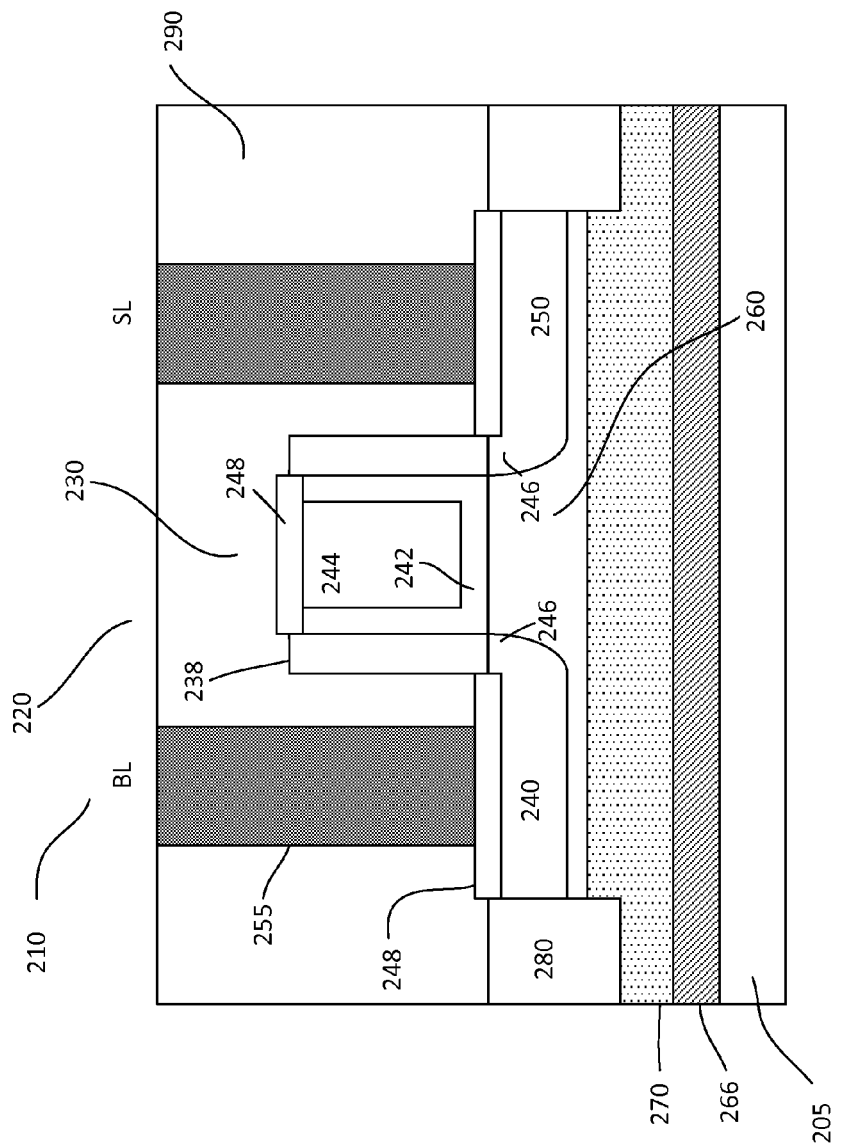

Referring to FIG. 4e, the substrate is planarized to remove excess gate dielectric and electrode materials. For example, the planarization process removes excess materials over the ILD layer. In one embodiment, the planarization process is CMP. Other types of planarization processes may also be useful. The CMP, for example, may use the ILD layer as a CMP stop. The planarization process forms a substantially coplanar surface with the ILD 490, the sidewalls spacers 238, the gate dielectric and gate electrode layers 242 and 244. The planarization process forms high-k metal gate structure in the gate opening.

The process may continue to complete the memory cell until a memory cell which is similar to FIG. 3e is formed. For example, metal silicide contacts 248 may be formed on the gate electrode (not shown) and S/D regions. The metal silicide contacts, for example, may be nickel-based metal silicide contacts. Other types of metal silicide contacts may also be useful. The metal silicide contacts facilitate reduced contact resistance. Additional processes further include forming additional dielectric layer to form the PMD layer 290, bitline and source line contacts 255 coupled to the S/D regions 240 and 250 and wordline contacts (not shown) coupled to the terminals of the memory cell or transistor as well as one or more interconnect levels, final passivation, dicing, assembly and packaging. Other processes may also be included. Techniques and materials of these features are the same as that already described in FIG. 3e. As such, details of these steps will not be described.

Figure 5A:
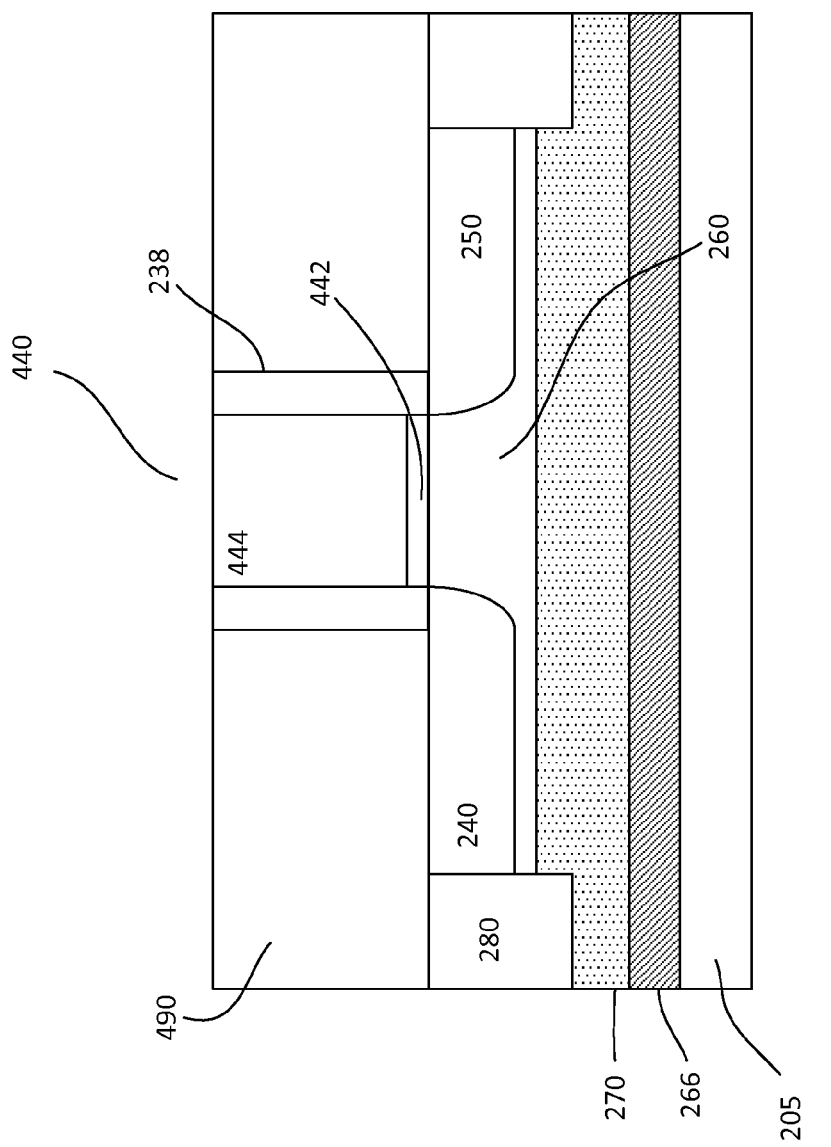
FIGS. 5a-5d show cross-sectional views of a process for forming yet another embodiment of a device.

FIGS. 5a-5d show cross-sectional views of a process for forming yet another embodiment of a device 500. The process may contain similar steps as that described in FIGS. 3a-3e, or FIGS. 4a-4e. In the interest of brevity, common elements may not be described or described in detail. As shown in FIG. 5a, a partially processed substrate and a dummy gate structure are provided. The partially processed substrate and dummy gate structure 440 is at the same stage as that described in FIG. 4c.

Figure 5B:
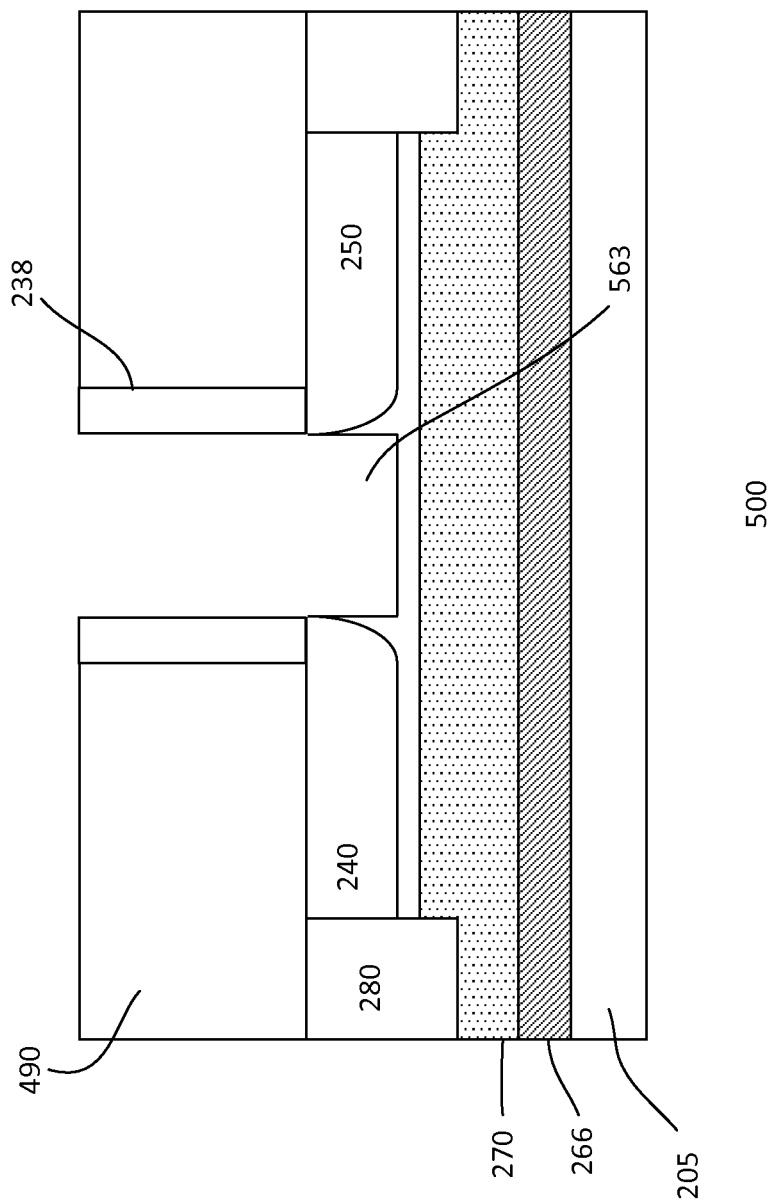

Referring to FIG. 5b, the dummy gate structure 440 is removed using techniques as described in FIG. 4d. Other suitable techniques may also be employed to remove the dummy gate structure. The removal of the dummy gate structure exposes a portion of top surface of the substrate. The process continues to form a trench 563 within a portion of the floating body 260 and in between the S/D regions 240 and 250. A mask and etch process is employed to remove portions of the substrate within the floating body to form the trench 563. For example, the trench is formed by RIE. The sides of the trench, for example, are self-aligned to the S/D extension regions. As shown, the depth of the trench is about equal to the depth of the S/D regions. Providing other depths or configurations may also be useful.

Figure 5C:
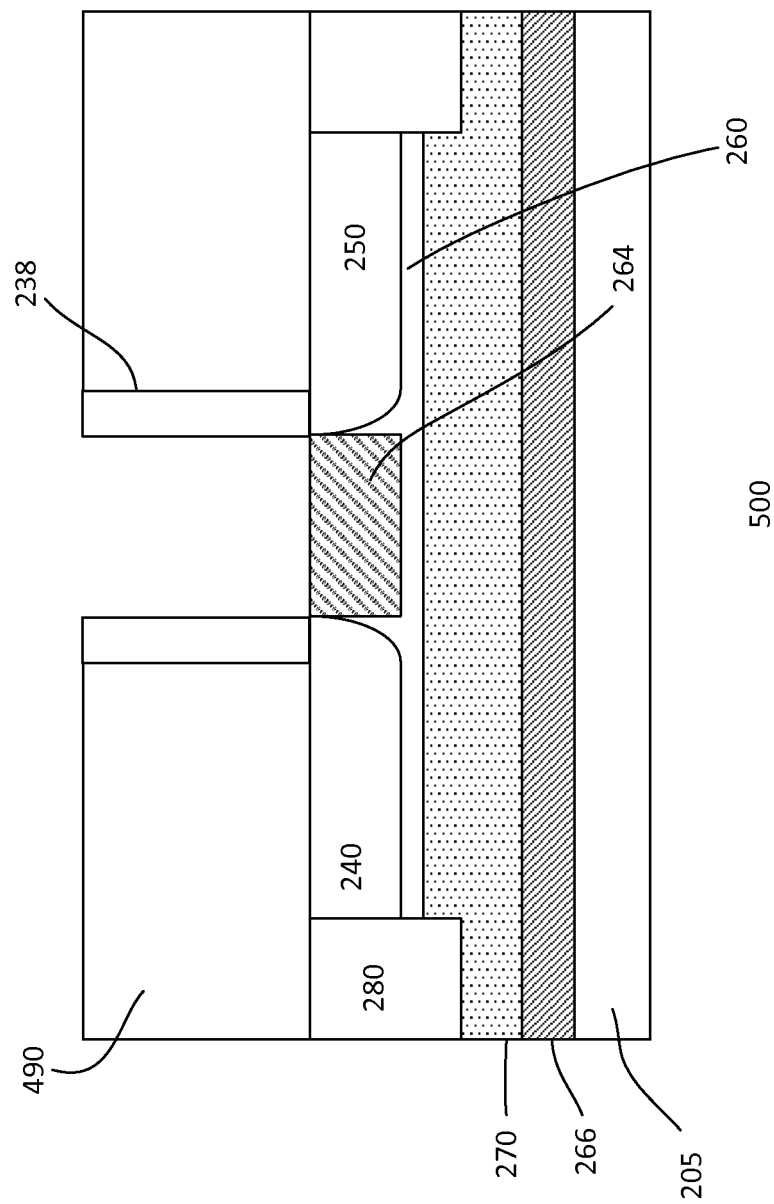

Referring to FIG. 5c, a band engineered (BE) portion 264 is formed within the trench 563. The BE portion is formed by, for example, selective epitaxial growth (SEG) process, filling the spaces within the recessed channel. As shown, the top of the BE portion is about coplanar with the top of the substrate surface. For example, the top of BE portion is also substantially coplanar with the top surface of the S/D regions 240 and 250. Forming the BE portion which is slightly recessed or over the substrate surface or the top surface of the S/D regions may also be useful. The BE portion, in one embodiment, is a silicon germanium (SiGe) BE portion. In another embodiment, the BE portion is lightly doped with second polarity type dopants. Other suitable types of BE portion may also be useful. For applications with BE portion, the floating body 260 may be modified to include Si:C. For example, the floating body 260 may be doped with C dopants. The concentration of C is, for example, 1-3%. Other techniques for providing a Si:C body may also be useful. For example, the body may be an epitaxial Si:C body. The epitaxial body may be in-situ doped Implanting the epitaxial body may also be useful. For applications without BE portion, S/D regions may be doped with C dopants. For example, Si:C S/D regions may be disposed within a Si body.

Figure 5D:
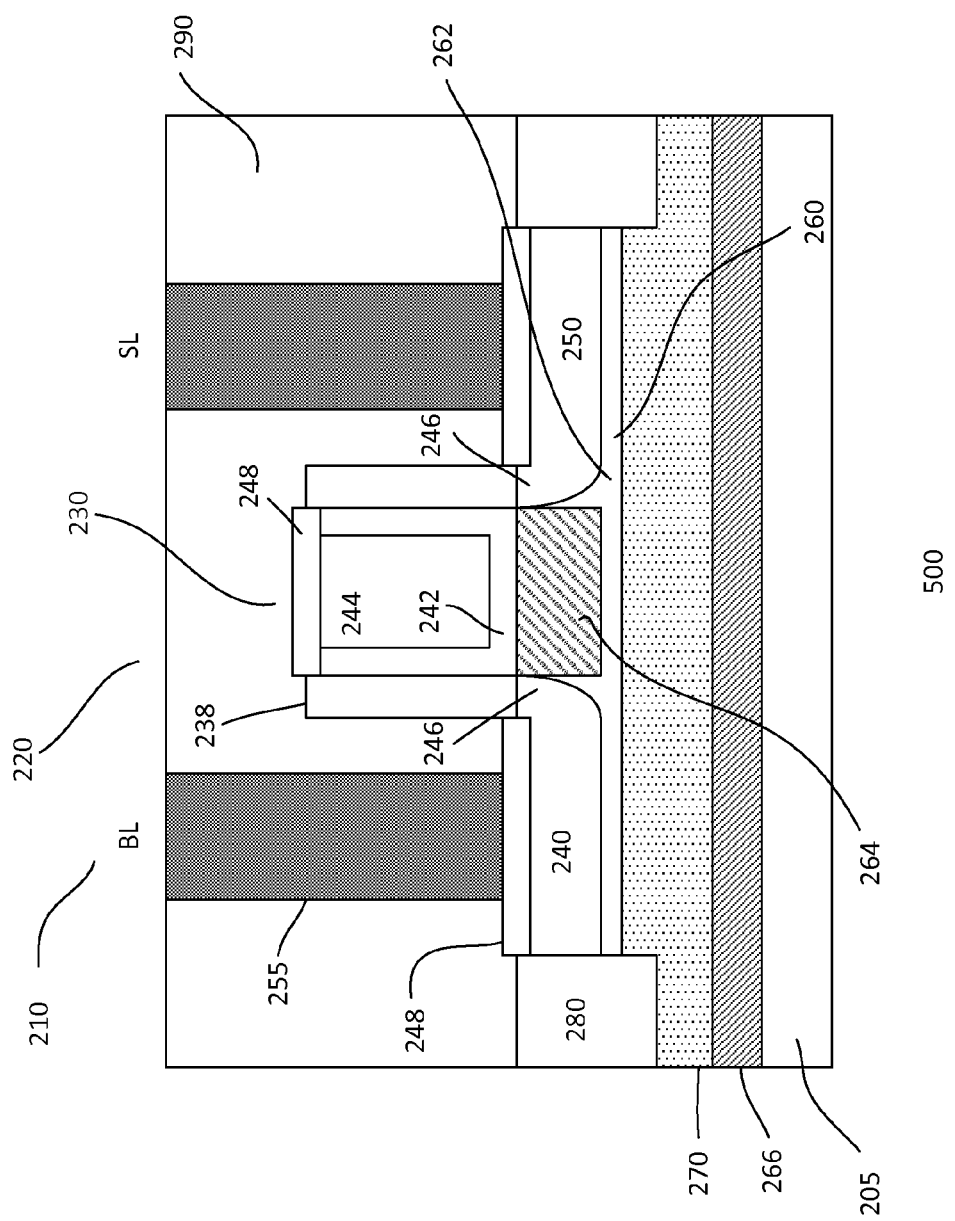

Referring to FIG. 5d, the process continues to form a high-k metal gate structure. The materials and techniques for forming the high-k metal gate structure is the same as that described in FIG. 4e. The process may continue to complete the memory cell. For example, the process continues to form silicide contacts, ILD layer, contacts etc. Additional processes may be performed, including forming one or more interconnect levels, final passivation, dicing, assembly and packaging. Techniques and materials of these features are the same as that already described in FIG. 3e. As such, details of these steps will not be described.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
a substrate having top and bottom surfaces, wherein the substrate comprises a device region surrounded by an isolation region;
an isolation buffer layer disposed in the device region and below the top substrate surface, wherein the isolation buffer layer is an amorphized portion of the substrate, and an area of the substrate between the isolation buffer layer and the top substrate surface serves as a body region of a transistor, and wherein the isolation region extends from the top substrate surface and partially into the isolation buffer layer; and
a transistor disposed in the device region over the substrate, the transistor comprises
a gate disposed on the top substrate surface, and
first and second diffusion regions disposed in the body region adjacent to first and second sides of the gate.

2. The device of claim 1 wherein the substrate comprises silicon and the isolation buffer layer comprises an amorphized silicon layer.

3. The device of claim 1 wherein the isolation buffer layer comprises amorphizing dopants which includes Si+, Ge, C, Ar, O, B, P or a combination thereof.

4. The device of claim 1 wherein:
the transistor is a first polarity type transistor;
the first and second diffusion regions comprise heavily doped first polarity type dopants; and
the substrate and the body region comprise lightly doped second polarity type dopants.

5. The device of claim 4 comprising a ground plane disposed below the isolation buffer layer, wherein the ground plane comprises first or second polarity type dopants.

6. The device of claim 1 wherein the gate comprises a gate electrode layer over a gate dielectric layer, wherein
the gate electrode layer comprises polysilicon or metal; and
the gate dielectric layer comprises silicon oxide or high-k dielectric material.

7. The device of claim 1 comprising a band engineered (BE) portion disposed in the body region, wherein:
the BE portion is disposed below the gate and between the first and second diffusion regions; and
the BE portion has a depth equal to about a depth of the first and second diffusion regions, leaving a gap between the BE portion and the isolation buffer layer.

8. The device of claim 7 wherein the BE portion comprises a silicon germanium BE portion.

9. The device of claim 7 wherein the body region comprises silicon doped with C dopants.

10. A method for forming a device comprising:
providing a substrate having top and bottom surfaces, wherein the substrate comprises a device region;
forming an isolation buffer layer in the device region, wherein forming the isolation buffer layer comprises amorphizing a portion of the substrate below the top substrate surface, and wherein an area of the substrate between the isolation buffer layer and the top substrate surface is not amorphized and serves as a body region of a transistor;
forming an isolation region in the substrate, wherein the isolation region surrounds the device region and the isolation region extends from the top substrate surface and partially into the isolation buffer layer; and
forming a transistor in the device region over the substrate, wherein forming the transistor comprises
forming a gate on the top substrate surface, and
forming first and second diffusion regions in the body region adjacent to first and second sides of the gate.

11. The method of claim 10 wherein amorphizing the portion of the substrate comprises implanting amorphizing dopant which includes Si+, Ge, C, Ar, O, B, P or a combination thereof into the substrate.

12. The method of claim 10 comprising forming a ground plane below the isolation buffer layer, wherein forming the ground plane comprises implanting first or second polarity type dopants.

13. The method of claim 10 wherein forming the gate comprises forming a gate dielectric layer over the substrate and forming a gate electrode layer over the gate dielectric layer, wherein
the gate electrode layer comprises polysilicon or metal; and
the gate dielectric layer comprises silicon oxide or high-k dielectric material.

14. The method of claim 10 comprising:
forming a dummy gate structure over the substrate;
forming an interlevel dielectric (ILD) layer over the substrate; and
removing the dummy gate structure after forming the ILD layer to form a gate trench, wherein the gate trench exposes a portion of the top substrate surface.

15. The method of claim 14 comprising forming a gate dielectric layer over the substrate and lining the gate trench and forming a gate electrode layer over the gate dielectric layer and filling remaining portion of the gate trench, wherein
the gate electrode layer comprises metal; and
the gate dielectric layer comprises high-k dielectric material.

16. The method of claim 14 comprising forming a band engineered (BE) portion in the body region, wherein forming the BE portion comprises:
forming a trench within a portion of the body region in between the first and second diffusion regions, wherein the trench comprises a depth equal to about a depth of the first and second diffusion regions, leaving a gap between the trench and the isolation buffer layer; and
forming the BE portion by a selective epitaxial growth process in the trench.

17. The method of claim 16 wherein the BE portion comprises a silicon germanium BE portion.

18. The method of claim 16 wherein the trench is formed by a reactive ion etch process.

19. The method of claim 10 wherein the first and second diffusion regions comprise a depth which is shallower and disposed above a top of the isolation buffer layer.

20. The device of claim 1 wherein the first and second diffusion regions comprise a depth which is shallower and disposed above a top of the isolation buffer layer.

* * * * *